United States Patent [19]

Wemmers

[11] 3,868,254

[45] Feb. 25, 1975

[54] POSITIVE WORKING QUINONE DIAZIDE LITHOGRAPHIC PLATE COMPOSITIONS AND ARTICLES HAVING NON-IONIC SURFACTANTS

[75] Inventor: Anton Wemmers, Den Hoorn, Netherlands

[73] Assignee: GAF Corporation, New York, N.Y.

[22] Filed: Nov. 29, 1972

[21] Appl. No.: 310,326

[52] U.S. Cl. .............................. 96/75, 96/33, 96/49, 96/85, 96/86 P, 96/91 D, 96/115 R, 117/34

[51] Int. Cl. ............................ G03f 7/08, G03c 1/54

[58] Field of Search ......... 96/91 D, 75, 49, 33, 114, 96/115 R, 114.5; 117/34

[56] References Cited

UNITED STATES PATENTS

| | | | |
|---|---|---|---|
| 2,400,532 | 5/1946 | Blake et al. | 96/114.5 X |
| 2,807,545 | 9/1957 | Frederick | 96/91 R |
| 2,995,442 | 8/1961 | Schmidt et al. | 96/91 D |
| 3,046,131 | 7/1962 | Schmidt et al. | 96/91 D |
| 3,050,389 | 8/1962 | Sus | 96/91 D X |
| 3,148,983 | 9/1964 | Endermann et al. | 96/91 D |
| 3,544,317 | 12/1970 | Yonezawa | 96/91 D |
| 3,586,504 | 6/1971 | Coates et al. | 96/91 D |
| 3,634,082 | 1/1972 | Christensen | 96/91 D |
| 3,637,384 | 1/1972 | Deutsch et al. | 96/91 D |
| 3,669,658 | 6/1972 | Yonezawa et al. | 96/91 D |

*Primary Examiner*—Charles L. Bowers, Jr.
*Attorney, Agent, or Firm*—Walter C. Kehm; Samson B. Leavitt

[57] ABSTRACT

An improved positive working lithographic plate is provided by incorporating a developing additive into the plate coating which allows rapid development of the plate with excellent clarity and definition. Additionally, this additive increases both the storage and press life of such plate. The additive may be a non-ionic surfactant such as an alkylphenoxy poly (ethylenoxy) ethanol, a quinone or a poly (lower alkyl vinyl ether) incorporated into a light sensitive coating made up of a novolak resin; for example, a novolak type condensation product of phenol and formaldehyde and a sensitizer; for example, a quinone diazide sensitizer.

6 Claims, No Drawings

POSITIVE WORKING QUINONE DIAZIDE LITHOGRAPHIC PLATE COMPOSITIONS AND ARTICLES HAVING NON-IONIC SURFACTANTS

This invention relates to positive working, presensitized photolithographic printing plates and particularly, to a light sensitive coating for such plates comprising a novolak resin, a quinonediazide sensitizer and a developing additive such as non-ionic, surface active agent; a quinone or substituted quinone or poly (lower alkyl vinyl ether).

Positive working, light sensitive compositions have been widely used to produce planographic printing plates suitable for use in offset prining. A positive printing lithographic plate is capable of reproducing light images directly, as exposed, on the surface of the printing plate. Areas of the plate which receive light do not print; areas receiving no light, print. Patents have been issued on the production of this type of plate, for example, U.S. Pat. No. 2,772,972 and U.K. Pat. No. 1,115,189. Additonally, many photosensitve compostions and Lithographic Printing plates have been described in the patent literature, for example, U.S. Pat. Nos. 3,046,123 and 3,175,906 and U.K. Pat. Nos. 1,115,027; 1,115,790; 1,096,618; 983,366; 937,525; 962,726; 708,834 and 699,412.

Prior art patents have shown the use of specific quinone diazide sensitizers, in conjunction wth phenolformaldehyde resins to form positive working, lithographic, light sensitive layers. On exposure to light, the quinonediazide is converted into a compound which is soluble in moderately alkaline liquids. The plate is developed by rubbing with such an alkaline liquid to remove the exposed parts. The more alkaline the developer, the more rapid and thorough the development. However, with prior art compositons, the activity of the developer must be limited because the non-exposed layer is not completely insensitive to the developer and sometimes small screendots are affected. The prior art plates, while serviceable, have a limited storage life and press life. Additionally, the developability, that is, the difference that can be achieved between exposed and unexposed areas of the plate has been unsatisfactory.

It is, therefore, an object of this invention to provide a positve working light sensitive composition and a positive working lithographic plate containing same which will not be subject to one or more of the above disadvantages.

Another object is to provide a composition for positive working lithographic plates which has increased developability.

A further object is to provide an economical, improved lithographic plate of increased efficiency due to greatly enhanced storage life and press life characteristics.

Yet another object is to provide an improved photosensitive composition for lithographic plates which allows more rapid developing without a concurrent loss in the difference between exposed and unexposed areas of the plate.

Other objects and many of the attendent advantages of this invention will be readily appreciated as the same become better understood by reference to the following description.

The subject invention, involving the addition of a developing additive such as a non-ionic surfactant, quinone, polyfunctional quinone, or poly (vinyl alkyl) ether to the sensitizer and resin composition of the prior art overcomes one or more of the disadvantages of the prior art heretofore described. This is accomplished with the advantage that such compositons are rendered capable of giving greater developability together with an improved storage and press life thus resulting in a degree of efficiency heretofore not attainable. This advance in the art, herein described, is quite unexpected and forms, in effect, the basis of a discovery.

In the practice of this invention, a composition ok a novolak resin, developing additive and sensitizer is prepared and then coated on a hydrophylic support, such as silica treated aluminum, or the type of plates described in U.S. Pat. No. 2,714,066. The plate is then exposed in a vacuum frame to a particular pattern of light produced through a screened, positive, photographic transparency or original. The transparency is generally, in this case, of the half-tone type. The light source can be sunlight, carbon arc light, mercury vapor light or some other source of ultra violet light of suitable intensity. After exposure, the plate is developed, the exposed areas are dissolved by contacting them with an aggressive aqueous alkaline solution. The plate is then fixed with an acidic medium and inked. The areas of the plate which were not exposed to light are oleophilic and will accept inking. The other areas of the coating, which have been exposed to light, have been removed through development and the hydrophilic substrate material remaining will not accept ink.

This improved composition when applied to form a positive printing, presensitized lithographic plate, greatly enhances the presss life of the plate, enables the use of relatively aggressive alkaline solutions for development, to decrease the time necessary to properly develop a plate and also by decreasing the sensitivity of the unexposed portion of the plate to alkali, provides a marked improvement in the development of small screen dots. The improved composition of the invention comprises, a developing additive admixed through a organic solvent medium, with a photosensitizing agent and a binder. The developing additive may be either a non-ionic surfactant containing from about 10 to about 100 ethylene oxide moieties or a polyfunctional quinone such as p-benzo-quinone or poly (lower alkyl vinyl ether). The non-ionic surfactants which may be used to advantage in my invention broadly include the following compounds:

A. A reaction product of ethylene oxide and alkyl or dialkyl phenols, e.g., alkyl phenoxy poly (ethyleneoxy) ethanols of the general formula:

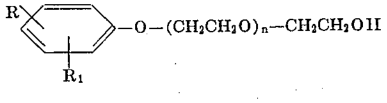

wherein R is an alkyl radical, preferably containing from about 6 to 12 carbon atoms; wherein $R_1$ is a radical selected from the group consisting of R and hydrogen, and although $R_1$ may be selected independently of R, it is preferably the same as R; and wherein $n$ is a positive number from about 10 to 100 inclusive. Specific examples of these compounds include: octylphenoxy poly (ehtyleneoxy)$_n$ ethanol, having $n$=12; nonylphenoxy poly (ethyleneoxy)$_n$ ethanol, having $n$=99; dodecylphenoxy poly (ethyleneoxy)$_n$ ethanol, having $n$=40; and dinonylphenoxy poly (ethyleneoxy)$_n$ ethanol, having $n$=50.

B. Fatty acid esters of poly (ethyleneoxy) ethanols of the general formula:

$$R-\overset{O}{\overset{\|}{C}}-O-(CH_2CH_2O)_n-CH_2CH_2OH$$

wherein R is an alkyl radical containing from about 6 to 26 carbon atoms, preferably from about 12 to 20 carbon atoms, and $n$ is a positive number from about 10 to about 100. These compounds include, for example, the lauryl ester of poly (ethyleneoxy)$_n$ ethanol, having $n$=10; the stearyl ester of poly (ethyleneoxy)$_n$ ethanol, having $n$=40; the myristyl ester of poly (ethyleneoxy)$_n$ ethanol, having $n$=80 and the tridecyl ester of poly(ethyleneoxy)$_n$ ethanol, having $n$=20.

C. Polyoxyethylated fatty alcohols of the general formula:

$$R - O - (CH_2CH_2O)_n - CH_2CH_2OH$$

wherein R is alkyl containing from about 6 to 26 carbon atoms and wherein $n$ is a positive number from about 10 to 100, for example, lauryl poly (ethyleneoxy)$_n$ ethanol, having $n$=50; stearyl poly (ethyleneoxy)$_n$ ethanol, having $n$=30; myristyl poly (ethyleneoxy)$_n$ ethanol, having $n$=80; and trideccyl poly (ethyleneoxy)$_n$ ethanol, having $n$=8.

D. Polyoxyethylated vegetable oils such as polyoxyethylated castor oil and polyexyethylated soybean oil, preferably where the weight ratio of polyoxyethylene to oil is between about 20 and 200.

E. A quinone such as p-benzoquinone and tetrachloro benzoquinone.

F. A poly (lower alkyl vinyl ether) of the general formula;

$$\left[-CH_2-\underset{}{\overset{O-R}{\overset{|}{CH}}}-\right]_n$$

wherein R is alkyl containing from 1 to 6 carbon atoms and wherien $n$ is a positive number from about 10 to about 100, these compounds include poly (vinylmethyl)$_n$ ether, poly (vinylisobutyl)$_n$ ether, and poly (vinyl ethyl)$_n$ ether.

The photosensitizers and their preparation are fully described, for example, in U.S. Pat. Nos. 2,797,213 and 2,772,972, particularly in Column 6, lines 7 – 73, and in a text entitled *Light Sensitive Systems*, by Jaromir Kosar, John Wiley & Sons, Inc., New York (1965) on pages 336–352.

An illustrative list of suitable photosensitizers includes:

1. N-dehydroabietyl-6 (5H)- diazo-5 (6H)-oxo-1-naphthalene sulfonamide
2. N-dehydroabietyl-3 diazo-4-oxo-1, 5 cyclohexadiene-1-sulfonamide
3. N-dehydroabietyl-3-diazo-4 (3)-oxo-1-naphthalenesulfonamide
4. N,N,'-didehydroabietyl-3-diazo-4 (3)-oxo-1,6-naphthalenesulfonamide
5. 3-diazo-4-(3)-oxo-1-naphthalenesulfonyl- chloride
6. N-dehydroabietyl-N-2 hydroxyethyl-6-diazo-5(6)-oxo-1-naphthalene-sulfonamide
7. N-dehydroabietyl-3-diazo-6-methyl-4-oxo-1,5-cyclohexadiene-1-sulfonamide
8. N-dehydroabietyl-5,6,7,8-tetrahydro-4-diazo-3(4)-oxo-2-naphthalene-sulfonamide
9. N-dextropimaryl-3-diazo-4-oxo-1, 5-cyclohexadiene-1-sulfonamide
10. N-dehydrobietyl-N-ethyl-6-diazo-5(6)-oxo-1naphthalenesulfonamide
11. N-dihydroabietyl-6-diazo-5(6)-oxo-1-naphthalenesulfonamide
12. N-tetrahydroabietyl-6-diazo-5(6)-oxo-1-naphthalenesulfonamide
13. 2,2'bis-(naphthoquinone-(1'',4'')-diazide-(4'')-2''-(sulfonyl-amino)-diphenyl-4,4'-disulfonic acid, and
14. Benzoquinone-(1,2)-diazide-(2)-4-sulfonic acid phenyl ester.

The binder used is an alkali soluble, permanently heat fusible condensation product of a phenolic compound and an aldehyde or aldehyde producing compound. These binder resins ar novolak tupe resins which must be both permanently heat fusible and soluble in organic solvents and alkaline solutions. Novolak resins are condensation products of phenolic compounds and aldehydes produced under acidic conditions. These acidic conditions favor production of a noncurable, permanently fusible type of resin with consumption of a high percentage of phenol. Generally, a mole ratio of 2 parts of phenol and less than one part formaldehyde refluxed under acidic conditions will produce a novolak resin. A number of phenolic compounds and aldehyde or aldehyde producing compounds will yield novolak resins through well known syntheses. Phenolic compounds that may be used include phenol,exlenol,cresol,resorcinol,naphthol,hydroquinone,alkyl phenols and halogenated phenols. Illustrative of the aldehydes and aldehyde producing compounds that may be used are formaldehyde, acetaldehyde, paraformaldehyde, formaline, acrolein, crotonaldehyde and furfural.

A distinctly different type of phenol-formaldehyde resin produced under alkaline conditions is known as a resole resin. These resins are not suitable for use with the composition of this invention because they are heat reactive. The shelflife of the compositions of the invention, prepared with a resole resin would be too short to be of practical value.

The solvent to be used with the invention can be any suitable liquid organic solvent or mixture of organic solvents meeting the following criteria: the solvent must be capable of dissolving the photosensitizing agent, the novolak resin and the developing agent in an amount sufficient to produce a homogeneous solution of at least about 1% total solid concentration. Additionally, the solvent must not chemically react with any of the components and must have a boiling point low enough to allow a practical drying time and temperature for the composition when applied to a substrate. Generally, the solvent must readily evaporate at a temperature of about 110°C or less within one to two minutes or less. Suitable solvents include: aliphatic ketones such as acetone, mehtyl ethyl ketone, diethyl ketone, methylpropylketone, methylbutylketone, methyl isobutylketone and the like; aliphatic esters such as ethylacetate, butylacetate, amylacetate and the like and aliphatic alcohols such as ethyl alcohol, isopropyl alcohol,butyl alcohol and the like; ethers such as ethyleneglycolmonomethyl ether and cyclic ethers such as dioxane. Additionally, certain solvent mixtures are found suitable such as ethyleneglycolmethyl ether and methyl ethyl ketone, isopropyl alcohol and dioxane.

Planographic printing plates of the present invention are prepared by applying the photosensitive composition solution on a supporting base by pouring, spreading, dipping, rolling or whirlcoating, in a conventional manner. The coating is dried at a moderate temperature (e.g., at 100°C in a circulating hot air oven). The coating may be applied in multiple layers, with each layer being dried before the next one is applied, so as to produce an overall coating of any desired thickness. However, it is one of the advantages of this invention that excellent plates can be produced with the application of a single layer coating.

The supporting base can be waterproofed paper, glass, metal plate, or metal foil. The metal plate or foil can be aluminum, steel, zinc, magnesium, copper or chromium. The planographic printing plates having a grained aluminum support base have been found to provide excellent printing reproducions.

The printing plate, after preparation, is exposed to a light source through a positive to form an image on the photosensitive surface. The light source can be sunlight, carbon-arc light, mercury vapor light or other light source customarily employed in photographic tracing and in printing work.

The image on the exposed plate can be developed by standard alkaline developing solutions such as aqueous trisodium phosphate of disodium phosphate solutions. However, if these solutions are used much of the advantage of this invention is lost. Preferably, faster, more alkaline, developing solutions are used having a pH of about 12 to 13.5. The preferred alkalinity can be achieved by adding any soluble inorganic alkali to a phosphate solution, for example, KOH or NaOH or mixtures of these compounds, may be used advantageously as well as simple aqueous solutions of KOH or NaOH, without phosphates. The amount of alkali may vary from about 0.1 gram to about 30 grams per liter depending upon the pH desired and the amount of disodium or trisodium phosphate if used may vary from about 10 grams to 100 grams per liter. For example, a developer solution prepared to contain 5 grams of NaOH and 45 grams of $Na_3PO_4 \cdot 10\ H_2O$ per liter of water gives excellent results.

Fixing may be accomplished with aqueous phosphoric acid solutions common to the art, as well as with many other acid solutions having a pH in the 1–3 range such as citric, tartaric or sulfuric acids and the like.

The amounts of each of the components of the sensitizing composition to be used will vary according to desirable design characteristics for the end item. The amount of sensitizer used based on the weight of resin binder may vary from about 10% to 50%, preferably from about 20% to 30%, to insure good bonding to the substrate. The amount of developing additive used will depend on the hydrophilic character of the additive. An additive with a high degree of hydrophilic characteristics (imparted, for example, by an increased number of polyoxyethylene units in the molecule) may be employed in lower amounts. Generally, since this invention is concerned with the production of positive working plates, wherein the composition constitutes the hydrophobic, printing portion, the amount of developing additive based on the weight of novolak resin is relatively small, and may run about 5% to about 50%, preferably from about 5% to about 20%, to insure that the composition will have oleophilic characteristics to properly retain ink after developing and fixing.

In order to obtain good images, it is necessary to prepare a relatively homogeneous solution having rheological properties compatible with existing coating techniques. Generally the total solids content of the solution may range from about 1% to 30% by weight depending on the viscosity imparted to the solvent by the dissolved composition and on the thickness of the plate desired.

Some preferred embodiments of this invention are set forth in the following examples. It is, of course, to be understood that these examples are only illustrative and not restrictive of this invention. All parts and proportions referred to herein and in the appended claims are by weight unles otherwise indicated.

EXAMPLE I 0.25 grams of nonylphenoxy poly (ethyleneoxy) ethanol of the formula

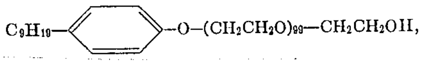

5.0 grams of a powdered novolak type resin obtained from a condensation product of phenol and formaldehyde and 1.5 grams of N dehydroabietyl-6(5H)-diazo-5(6H)-oxo-1-naphthalene-sulfonamide are added with mixing to enough methyl-isobutylketone to prepare 30 ml of solution. This solution is applied to a mechanically grained aluminum plate by whirlcoating at approximately 100 RPM until a uniform coating of the composition is obtained. The coating is dried for 1 minute at 100°C.

Following exposure to an arc light, through a screened positive original, in a vacuum frame, the exposed areas are dissolved by rubbing with a cotton pad soaked in an aqueous solution containing 5 grams NaOH and 45 grams $Na_3PO_4 \cdot 10\ H_2O$ per liter to develop the image. The developed coating is then rinsed with water, fixed with a 1% phosphoric acid solution and the coated plate subsequently attached to an offset lithographic press. After a pressrun of 5000 copies, the plates used do not evidence any wear. In contrast, with a plate devoid of the additive of this invention, considerable wear is observed in a run of 5,000 copies. If a less aggressive developer is used, which would be necessary in the absence of the additive of this invention, development would require about twice the time and greatly increase the risk of incomplete development in a 95% density screen.

EXAMPLE II 0.4 grams of octylphenoxy poly (ethleneoxy) ethanol of the formula

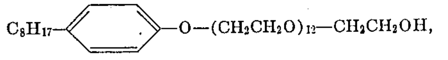

4 grams of a powdered novolak type resin, obtained from a condensation product of cresol and acetaldehyde, and 1.8 grams of N-dehydroabietyl-3-diazo-4-oxo-1,5 cyclohexadiene-1-sulfonamide are added slowly with mixing to 50 cc. of methyl ethyl ketone to form a coating compositon. The coating composition thus prepared is applied to grained aluminum foil by whirl coating. The coating is then dried at about 100°C for about 1 minute. The prepared plate is then exposed to an arc light, through a screened positive original, in a vacuum frame and developed as in Example I, except that a 10% aqueous solution of trisodium phosphate containing 3 grams per liter of NaOH is used. The developed plate is then washed with water and fixed using a 5% phosphoric acid solution. The fixed image is then tested on an offset lithography press, with results similar to those of Example I.

EXAMPLE III 0.4 grams of dodecylphenoxy poly (ethleneoxy) ethanol of the formula

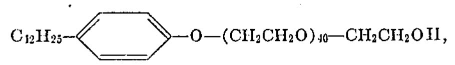

4 grams of a powdered novolak resin, obtained from a condensation product of resorcinol and formaline, and 1.6 grams of N-dehydroabietyl-3-diazo-4(3)-oxo-1-naphthalene-sulfonamide are added with mixing to 60 cc of a 50/50 weight/weight mixture of ethylene glycolmonomethyl ether and methyl ethyl ketone to form a coating soluton. This solution is then applied by the previously described whirling technique to a mechanically grained zinc plate. The coating is dried, exposed and developed by the same method as employed in Example I. The developed plate thus prepared is then tested on an offset lithographic press, with results similar to those of Example I.

EXAMPLE IV 1.0 grams of dionyl phenoxy poly (ethlencoxy) ethanol of the formula

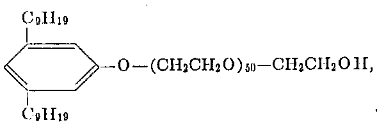

5 grams of powdered novolak resin obtained from a condensation product of naphthol and paraformaldehyde, and 1.0 grams of N,N'-didehydroabietyl-3-diazo-4(3)-oxo-1,6-naphthalene-disulfonamide are added with mixing to 100 cc of a 50/50 Weight/Weight mixture of isopropyl alcohol and dioxane. This solution is then applied to mechanically grained aluminum foil. The coating is dried, exposed, developed and tested in a manner identical to that of Example I. Similar results are obtained.

In accordance with this invention, a number of non-ionic surfactants are used, as developing additives, as well as p-benzoquinone, tetrachlorobenzoquinone and poly (vinylmethyl ether) in combination with a powdered novolak resin, obtained as a condensation product of phenol and formaldehyde, and various quinone diazide sensitizers in a suitable organic solvent medium. The compositions are coated on various substrate plates, and the coated plates exposed, developed and tested in the same manner as in Example I. Some of these compositions are listed as Examples 5–13 in Table 1 following. The amount of novolak resin is kept constant at 5.0 grams and the amount of sensitizer, solvent and additive varied as indicated. When these compositions are applied to grained aluminum plates, results are similar to those obtained in Example I.

TABLE I

| Example number | Developing additives | Amount of additive, gms. | Sensitizer number from | Sensitizing amt. in gms. | Solvent system | Amount of solvent, cc. |
|---|---|---|---|---|---|---|
| 5 | $C_{13}H_{27}-O-(CH_2CH_2O)_8-CH_2CH_2OH$ | 0.75 | 5 | 1.0 | Dioxane | 50 |
| 6 | $C_{18}H_{37}-O-(CH_2CH_2O)_{30}-CH_2CH_2OH$ | 0.6 | 1 | 1.0 | Ethylene glycol monomethyl ether | 40 |
| 7 | $C_{11}H_{23}-C(=O)-O-(CH_2CH_2O)_{10}-CH_2CH_2OH$ | 1.25 | 6 | 1.0 | Methyl propyl ketone | 40 |
| 8 | Polyethoxylated castor oil 20% by weight polyoxyethylene. | 2.0 | 7 | 0.75 | Ethyl acetate | 30 |
| 9 | Polyethoxylated soybean oil 70% by weight polyoxyethylene. | 0.2 | 8 | 0.75 | Amyl acetate | 50 |
| 10 | $C_{17}H_{35}-C(=O)-O-(CH_2CH_2O)_{40}-CH_2CH_2OH$ | 0.5 | 9 | 1.0 | Ethyl alcohol | 50 |
| 11 | P-benzoquinone | 0.25 | 10 | 1.5 | Acetone | 50 |
| 12 | Tetrachlorobenzoquinone | 0.25 | 11 | 1.5 | Ethylene glycol monomethyl ether | 50 |
| 13 | Poly (vinylmethyl) ether having 20 repeating units. | 0.25 | 12 | 1.5 | do | 50 |

This invention has been developed with respect to certain preferred embodiments, and various modifications and variations thereof will become obvious to persons skilled in the art, and are to be included within the spirit and purview of this invention and the scope of the appended claims.

What is claimed is:

1. In a positive working, photosensitive lithographic composition, for use as a coating on a hydrophilic substrate, said composition having a quinone diazide sensitizing agent and a novolak resin binder, the improvement comprising: the employment of a non-ionic surfactant as a developing additive in said composition to impart enhanced developability characteristics, said non-ionic surfactant being a reaction product of ethylene oxide and a compound selected from the group consisting of alkyl phenols and dialkyl phenols.

2. A composition as defined in claim 1, wherein said employment is effected through the use of an organic solvent medium.

3. A composition as defined in claim 1, wherein said reaction products contain from about 10 to about 100 ethylene oxide moities.

4. A composition as defined in claim 1, wherein said ethylene oxide reaction product has the general formula

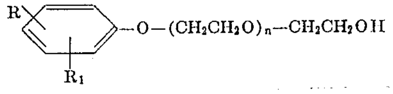

wherein R is a radical selected from the group consisting of alkyl containing from about six to about 12 carbon atoms and H, at least one of said R radicals being alkyl and wherein *n* is a positive number from about 10 to about 100.

5. A composition as defined in claim 4, wherein said reaction product is selected from the group consisting of:

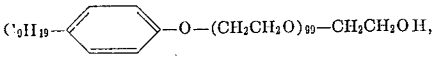

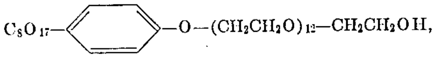

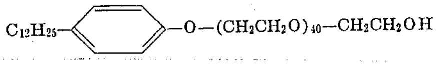

and

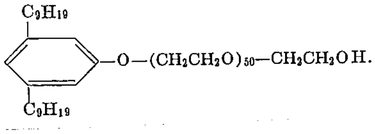

6. A light sensitive, positive working, lithographic printing plate comprising: a hydrophilic support coated with the composition as defined in claim 1.

* * * * *